(12) United States Patent
Hara

(10) Patent No.: US 6,387,713 B2
(45) Date of Patent: May 14, 2002

(54) METHOD FOR MANUFACTURING MICROFABRICATION APPARATUS

(75) Inventor: Masaki Hara, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/874,165

(22) Filed: Jun. 4, 2001

(30) Foreign Application Priority Data

Jun. 5, 2000 (JP) ........................................ 2000-167421

(51) Int. Cl.$^7$ .................................................. H01L 21/00

(52) U.S. Cl. ............................ 438/3; 438/412; 257/421

(58) Field of Search ........................... 438/3, 405, 406, 438/412; 257/421

(56) References Cited

U.S. PATENT DOCUMENTS 4,883,773 A * 11/1989 Ishikura ........................ 438/3
5,515,984 A * 5/1996 Yokoyama et al. ............ 438/3
5,658,820 A * 8/1997 Chung ........................... 438/3

FOREIGN PATENT DOCUMENTS

EP          0 063 917      * 11/1982      ........... H01L/21/90

* cited by examiner

Primary Examiner—Charles Bowers
Assistant Examiner—David S Blum
(74) Attorney, Agent, or Firm—Frommer Lawrence & Haug LLP; William S. Frommer

(57) ABSTRACT

To offer a microstructure fabrication apparatus capable of realizing MEMS and a Rugate Filter excellent in performance characteristics by patterning a thick functional material film in high aspect ratio with a simple and practical manufacturing method. A Si layer is employed for a mask pattern. The advantages of the Si layer are withstood a process conducted at high temperature for forming a PZT layer, which is the functional material layer, patterned in high aspect ratio, and achieves excellent process consistency for the whole manufacturing processes of the microfabrication. A trench or a gap is formed with the mask pattern deeper than the desired PZT layer. The PZT layer, or functional material layer (films) is formed on the whole surface including the bottom of the concave part of the mask pattern. The PZT layer deposited on the mask pattern is removed with the mask pattern itself, and selectively remains the pattern of the PZT layer, thereby obtaining a pattern of the desired functional material layer.

13 Claims, 4 Drawing Sheets

METHOD FOR MANUFACTURING MICROFABRICATION APPARATUS

BACKGROUND OF THE INVENTION

1. Field of the Invention

The present invention relates to a method for manufacturing a microfabrication apparatus, which is specifically preferable for manufacturing Micro Electro Mechanic Systems (hereinafter, it is referred to as MEMS) or a Rugate Filter, these apparatuses are required to process a thin functional material film ranging from several $\mu$m to 100 $\mu$m or more as a pattern with high aspect ratio ranging from 3 to 10 or more.

2. Description of the Related Art

In MEMS, a microstructure is formed by processing a functional material film such as piezoelectric materials or magnetic materials. For achieving a desired sensing function or actuation function in practical use, the microstructure is required to have at least several $\mu$m thick or more, desirably, 100 $\mu$m thick or more, and is patterned in a manner of obtaining high aspect ratio.

Among them, the piezoelectric material can be both sensor and actuator functions, so that there are the following advantages: a structure can be simplified in case of using a single function in either one of the above two functions, and the piezoelectric material can be applied to use for the both functions. Therefore, the piezoelectric material is especially expected to use as a component material of a main operation portion of MEMS. Similarly, in a micro fabrication apparatus such as the rugate filter using optical functional materials, for instance, a technique where a thick functional material is processed as a pattern with high aspect ratio, is earnestly required besides MEMS.

In case of employing the piezoelectric material for a microactuator such as micropump, a small-sized ultra sonic motor, and a micro cantilever, or for a micro ultra sonic source, practical performance distance or output is required. Hence, take PZT, which is a solid solution of lead titanate and lead zirconate (Pb (Ti, Zr)O$_3$; hereinafter it is referred to as PZT) for instance, a thick layer of at least about several $\mu$m is needed, further desirably, a thick layer ranging from several 10 $\mu$m to 100 $\mu$m or more is useful.

Conventionally, the structure of the functional material film made of the above piezoelectric material is manufactured by a mechanical processing performed in bulk materials or a screen printing method. For this reason, the mechanical processing and the screen printing method are techniques capable of forming a pattern in a thick film. As other methods, for example, a technique where thin films are laminated many times with sputtering or a CVD (Chemical Vapor Deposition) method, is suggested.

However, in the mechanical processing, the functional material film is hard to be patterned accurately because failure of members occurs during processing or handling, or characteristics vary when adhering.

In case of the screen printing method, sintering temperature rises at 500 to 800° C. or more, so that the substrate and other structure members tend to be damaged, and additionally, the film is hard to be formed in high density. With the above reasons, there is a tendency where optimum quality as a functional material layer is failed to obtain.

Further, in the technique where a thick film is formed with sputtering or the CVD method, a process of forming film at comparatively low temperature can be generally conducted. Meanwhile, deposition of the thick film of several 10 $\mu$m or more considerably takes time, so that the above technique is not suitable for manufacturing process in practical use. Additionally, there is a tendency that accurate etching process is difficult to be performed in the functional material film formed by depositing many times for a long time.

A thick film made of the functional material may be formed with the sputtering or the CVD method, then is patterned with a lift-off method in stead of etching. Here, in general, the lift-off method is a method such that photoresist is used as a pattern, then the pattern is separated in order to gain a desired pattern.

However, with the lift-off method, only a functional material film formed at low temperature can be formed. For this reason, in case of using photoresist as a pattern, deformation or burning occurs in photoresist when heating the substrate at about 150° C. or more. This fails to perform the lift-off method, hence, a method for forming the functional material film is strictly limited due to processing temperature.

According to a LIGA (Lithographie Galvanoformung Abfprumng) process employing a X-ray lithography, resist can be realized to pattern in several 100 $\mu$m. However, this method is not industrially practical in the following points: a X-ray lithography apparatus is unusual and expensive; special structure using a material having sufficient shielding characteristics (e.g. Au (gold)) for a X-ray having high permeability is employed, and an expensive complicated photomask is needed for manufacturing.

As other lift-off methods, it is suggested that a SiNx film or SiO$_2$ film is employed. In this case, forming layer can be performed at high temperature, so that limitation on the processing temperature eases. On the other hand, the SiNx film or the SiO$_2$ film is extremely difficult to be patterned in the aspect ratio 3 or more.

As described above, each of the conventional techniques has the problems such that the thick film made of the functional material having at least several $\mu$m or more is difficult or impossible to be patterned in the high aspect ratio 3 or more. As a result, various microfabrication apparatuses excellent in performance characteristics can not be realized.

The invention has been achieved in consideration of the above problems and its object is to provide a method for manufacturing a simple and practical microfabrication apparatus achieving MEMS and the rugate filter excellent in performance characteristics by patterning a thick film made of a functional material film.

SUMMARY OF THE INVENTION

A method for manufacturing a microfabrication apparatus comprises steps of forming a mask pattern by providing a trench or a gap deeper than a desired functional material layer within a semiconductor layer, depositing the functional material layer in a manner to be thinner than the semiconductor layer, and obtaining a pattern of the functional material layer by removing the mask pattern.

A method for manufacturing a microfabrication apparatus comprises steps of forming a mask pattern by coating a surface of a photoresist layer with a cap film after a trench or a gap deeper than a desired functional material layer is provided within the photoresist layer, depositing the functional material layer in a manner to be thinner than the photoresist layer at least in the trench or the gap of the mask pattern, and obtaining a pattern made of the functional material layer by removing the mask pattern.

A method for manufacturing a microfabrication apparatus comprises steps of forming a mask pattern by providing a trench or a gap deeper than a desired functional material layer within an organic compound film, depositing the functional material layer in a manner to be thinner than the organic compound film at least in the trench or the gap of the mask pattern, and obtaining a pattern of the functional material layer by removing the mask pattern.

According to the method for manufacturing the microfabrication apparatus of the present invention, a semiconductor layer is employed as a mask pattern in order to form a trench or a gap deeper than a desired functional material layer, and the functional material layer (film) is formed on the whole surface including a bottom of a concave part of the trench or the gap. The advantages of the semiconductor layer are withstood a process for forming the functional material layer conducted at high temperature, patterned in high aspect ratio, and achieves excellent process consistency for the whole manufacturing processes of the microfabrication apparatus. The functional material layer deposited on the mask pattern is removed with the mask pattern itself. Then, the functional material layer deposited on the bottom of the concave part of the mask pattern only remains selectively in order to obtain a desired pattern of the functional material layer. In this time, the trench or the gap deeper than the functional material layer is provided in the mask pattern, so that the functional material layer is disposed on the mask pattern and in the bottom of the concave part of the mask pattern in a manner to be separated between a pattern edge of the functional material layer disposed on the concave part of the mask pattern and a pattern edge of the functional material layer disposed on the mask pattern. Accordingly, the mask pattern is removed (lift-off) performed while both sides of the pattern edges of the functional material layer disposed on the concave part of the mask pattern keeps intact.

In the method for manufacturing another microfabrication apparatus according to the present invention, instead of using the semiconductor layer as a mask pattern, a photoresist layer further excellent in process consistency is patterned and coated its surface with a film cap, and employed.

In the method for manufacturing another microfabrication apparatus according to the present invention, instead of using the semiconductor as a mask pattern, an organic compound film is employed. The organic compound film is adapted to a larger pattern and can be patterned or separated more simply.

A silicon substrate, which can be processed simply is employed as a semiconductor layer, and the silicon substrate may be bonded on another substrate such as a grass substrate with an anodic oxidation method, which is a simple process. A silicon portion of a SOI (Silicon On Insulator) substrate, which can be obtained with a simple process may be employed as a semiconductor layer.

Other and further objects, features and advantage of the invention will appear more fully from the following description.

BRIEF DESCRIPTION OF THE DRAWINGS

These and other objects and features of the present invention will become clear from the following description of the preferred embodiments given with reference to the accompanying drawings, in which.

DETAILED DESCRIPTION OF THE PREFERRED EMBODIMENTS

Figure 1A:
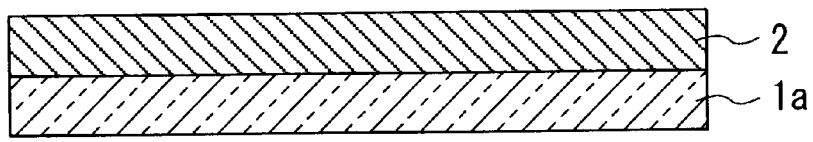
FIGS. 1A to 1F are views specifically showing a step of patterning a PZT layer, which is a functional material film with Si as a mask pattern in a manufacturing method relative to a first embodiment of the present invention.

Embodiments of the present invention will be described in detail hereinbelow by referring to the drawings.

[First Embodiment]

FIGS. 1A to 1E are views showing a manufacturing method relative to the first embodiment of the present invention. First, as shown in FIG. 1A, a 4-inch Si (silicon) substrate of about 200 μm thick is bonded on another substrate such as a refractory grass substrate 1a whose outer dimension is 4 inch long and 200 μm thick with an anodic oxidation method. This Si substrate is a Si layer 2. The Si layer 2 may be formed by depositing a Si film having a desired thickness on the grass substrate 1a.

Figure 1B:
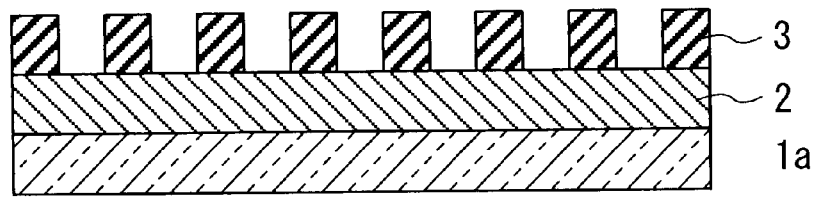
Figure 1C:
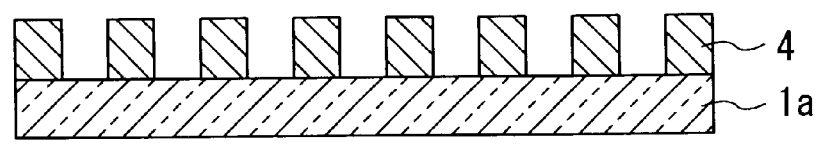

Next, a photoresist is applied on a surface of the Si layer 2 to form a resist pattern 3 as shown in FIG. 1B with a photolithography method and the like. While using the resist pattern 3 as a mask, the Si layer 2 is patterned with a dry etching method called as a Deep-Si (silicon) RIE (Reactive Ion Etching) method, which is a kind of Bosch process and further, the resist pattern 3 is separated so as to form a mask pattern 4 as shown in FIG. 1C. The mask pattern 4 is employed for patterning the Si layer 2 with the lift-off method. The mask pattern 4 may be a rectangular shape, and measure by for example, 200 μm long, 10 μm wide, 200 μm deep. The Bosch process is a technique such that $SF_6$ gas and $C_4F_8$ gas are alternately supplied to generate high-density plasma for performing the dry etching.

Figure 1D:
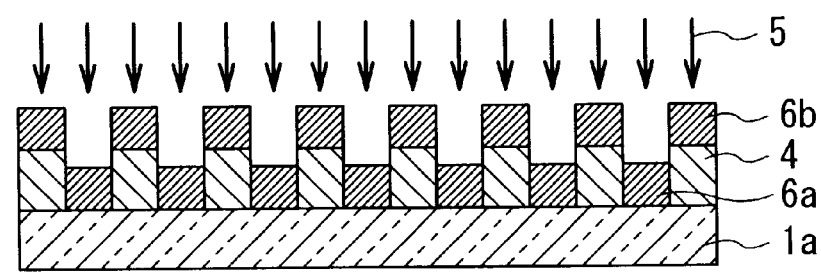

The whole substrate on which the Si mask pattern 4 is formed is exposed to a rare HF (hydrogen fluoride) solution, then cleans its surface. After this, as shown in FIG. 1D, PZT layers 6a and 6b of 150 μm in thickness are deposited on the whole surface of the substrate including the portion on the mask pattern 4 by insufflating a PZT (lead zirconate titanate) particle flow 5 at high speed with a gas deposition method (a jet printing method). However, in this time, the PZT layers 6a and 6b are not always necessary to be formed on the whole surface of the substrate. The PZT layer 6a may be selectively formed in the vicinity of the desired mask pattern 4. A process condition inside a deposition chamber may be determined in the following conditions: pressure is 133.3 Pa (1 Torr), the distance from a nozzle to the substrate is 5 mm, differential pressure for insufflating from the nozzle is 66.7 Pa (0.5 Torr), and substrate temperature is 100° C. Particle diameter of raw powder of the PZT layers 6a and 6b is desirably, for instance, 0.7 μm or lower for ensuring film quality such as dense and so on.

Figure 1E:
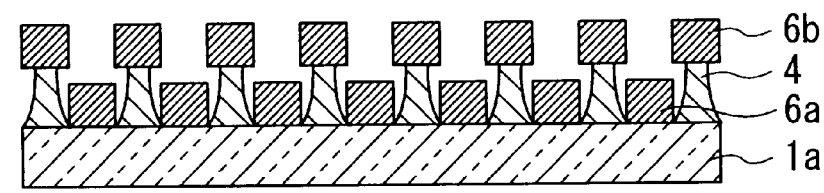
Figure 1F:
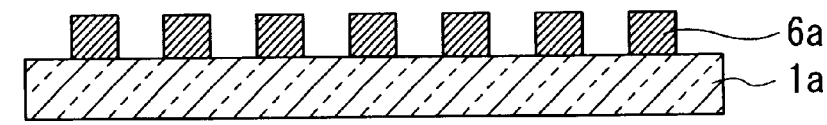

Following this, the substrate is maintained inside an unillustrated vacuum chamber, then, the Si mask pattern 4 and the PZT layer 6b, which has been deposited thereon are completely removed by introducing $XeF_2$ (xenon fluoride) via sublimation, thereby achieving a pattern made of the PZT layer 6a as shown in FIG. 1E. In place of $XeF_2$, the Si mask pattern 4 can be also removed with $BrF_3$ (bromine trifluoride). The pressure inside the vacuum chamber in this time may be determined as about 66.7 Pa. When the PZT layers 6a and 6b are formed, the surface of the substrate is planarized by lapping (abrading) if needed, then an upper electrode and so on (an illustration is omitted in FIGS. 1A to 1F) can be formed thereon. The electrodes are formed on and beneath the PZT layer 6a (an illustration is omitted in FIGS. 1A to 1F), thereby completing a functional material layer shown in FIG. 2. The functional material layer is a main structure for operating the microfabrication apparatus.

As described above, in the method for manufacturing the microstructure fabrication apparatus relative to the embodiment, the pattern of the PZT layer (the functional material layer) 6a having the following advantages can be obtained: a layer is as thick as 200 μm; the aspect ratio is extremely as high as 30 or more, and edge repeatability is excellent. Additionally, the PZT layer 6a can be deposited in a uniform thickness in a predetermined position for a short time because of using the gas deposition method. The Si layer 2 is slightly thicker than the PZT layer 6a in order to form a little space between the Si mask pattern 4 and the pattern of the PZT layer 6a. This ensures removing the Si layer 2 since the Si layer 2 is selectively subjected to etching from the above fine space with $XeF_2$ or $BrF_3$.

Figure 2:
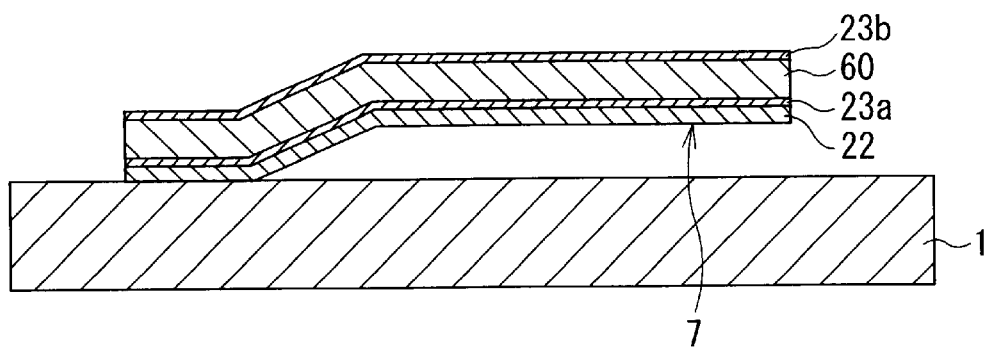
FIG. 2 is a cross sectional view showing a structure of a micromirror, which is an example of the microfabrication apparatus produced by a manufacturing method relative to an embodiment of the present invention.
Figure 3:
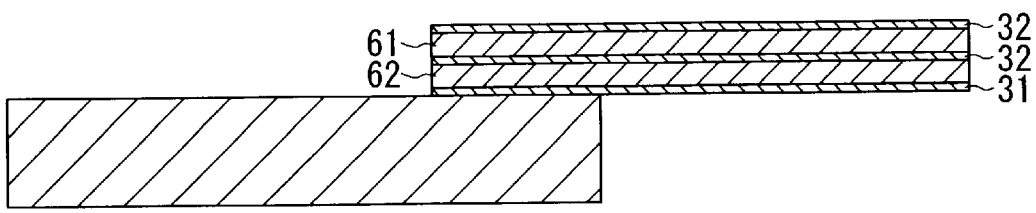
FIG. 3 is a cross sectional view showing a structure of a microactuator, which is an example of the microfabrication apparatus produced by a manufacturing method relative to an embodiment of the present invention.

By employing the PZT layer 6a patterned with the above manufacturing method as a piezo element, for example, a micromirror shown in FIG. 2 and a microactuator (micro cantilever) in FIG. 3 and so on can be manufactured.

In the micromirror shown in FIG. 2, a mirror face 7 is operated in an up-down direction in the drawing by controlling voltage applied to a PZT layer 60. The microactuator shown in FIG. 3 is determined in a manner to operate the cantilever in an up-down direction in the drawing by controlling voltage respectively applied to a first PZT layer 61 and a second PZT layer 62.

In either case of the microfabrication apparatuses, the PZT film of several 100 μm or more is formed, then processed as the pattern having high aspect ratio with excellent repeatability, thereby obtaining the PZT layers 60, 61, and 62. In addition, because of using the Si layer 2 as the mask pattern 4 for patterning, the microfabrication apparatus using a material film, which is necessary to be formed at high temperature can be manufactured. As a result, the microfabrication apparatus including sufficient practical functions can be realized.

In case of the micromirror shown in FIG. 2, steps of forming a sacrifice layer (an illustration is omitted) for finally forming a void portion 21, and a SiNx (silicon nitride) layer 22 and Au (gold) electrodes 23a and 23b are further necessary as well as the step of forming and patterning the PZT layer 60. In case of the microactuator shown in FIG. 3, the following steps are further necessary in order to achieve operation in both up and down directions in the drawing as the cantilever: a step of forming a lower Pt (platinum) electrode 31, a middle Pt electrode 32, and an upper Pt electrode 33, a step of forming the first PZT layer 61 and the second PZT layer 62 with the middle Pt electrode 32 in-between, and a step of protruding the structure (the cantilever) using the PZT layers 61 and 62 after partly removing the substrate 1.

[Second Embodiment]

FIGS. 4A to 4E are views showing an example of a case where a silicon cap film is coated on the surface of the thick photoresist pattern instead of Si layers and used as a pattern made of the Si mask pattern. Here, the explanation will be mainly focused on differences from the first embodiment, the same processes and effects will be simplified.

Figure 4A:
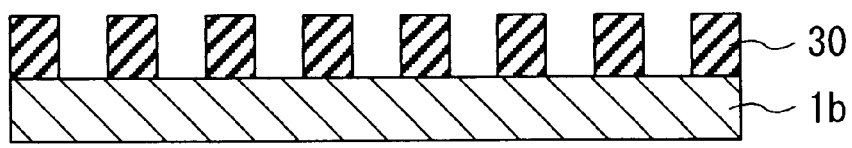
FIGS. 4A to 4E are views specifically showing a step of patterning the PZT layer, which is the functional material layer with resist and a cap film as a pattern in a manufacturing method relative to a second embodiment of the present invention.

A UV-LIGA method is an ideal technique to perform patterning on the thick resist with a collimation technique excellent in straight-line characteristics of UV light. With the UV-LIGA method, patterning on a desired thick resist can be performed. That is, as shown in FIG. 4A, for example, a positive UV resist of 150 μm is applied on the Si substrate 1b of 4 inch long and 400 μm thick, then photolithography is performed with a mask aligner having collimation characteristics excellent in straight-line characteristics, (this is the so-called UV-LIGA method), thereby a resist pattern 30 whose pattern gap (space) is about 10 μm in width, 150 μm in depth, and 200 μm in length, is formed.

Figure 4B:
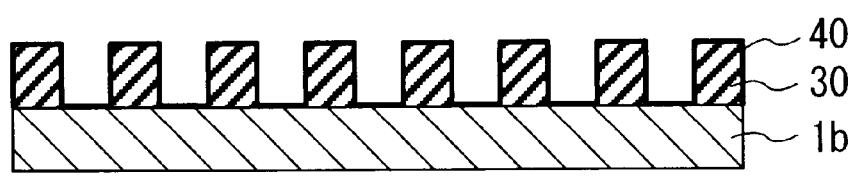

With a plasma CVD method using low temperature at about 100° C., for instance, as shown in FIG. 4B, a thin $SiO_2$ film of about 15 nm is deposited on the almost whole surface of the substrate including the photoresist pattern 30 functioning as a cap film 40. The resist pattern 30 coated with the cap film 40 can be used in a similar manner to the mask pattern 4 in the first embodiment.

Figure 4C:
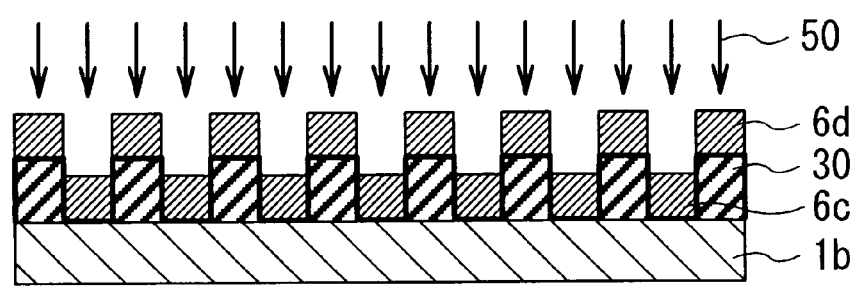

Next, as shown in FIG. 4C, a PZT particle flow 50 is insufflated at high speed so as to deposit PZT layers 6c and 6d of 80 μm, for example with the gas deposition method.

Figure 4D:
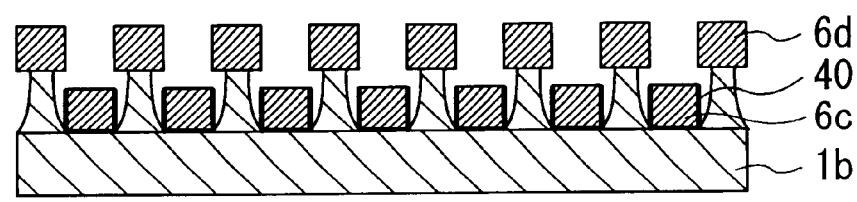
Figure 4E:
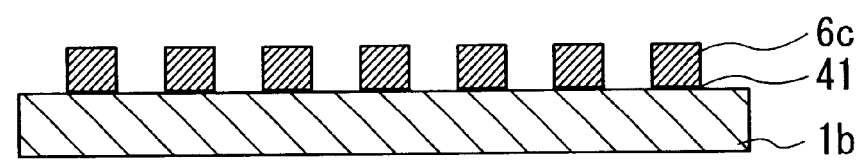

Although an illustration is omitted, after the whole substrate is immersed in about a five-percent rare HF solution for a short time to selectively remove the $SiO_2$ film, as shown in FIG. 4D, the whole wafer is immersed in a solvent for dissolving the resist in order to dissolve or separate the photoresist pattern, and the PZT layer 6d provided thereon is also removed. This can obtain the pattern made of the PZT layer 6c measuring by 10 μm in width, 80 μm in thickness, and 200 μm in length as shown in FIG. 4E, for instance, on the Si substrate.

Generally, there is likely to fail to achieve patterning excellent in the edge repeatability with the gas deposition method because the resist pattern 30 is deformed or partly defected when it is exposed to the high-speed gas flow, which gives shock to the resist pattern 30. However, as described above, the resist pattern 30 is protected by the cap film 40 made of the thin $SiO_2$ film, so that no deformation or defection of the resist pattern 30 occurs even if the high-speed gas flow is insufflated, thereby patterning excellent in the edge repeatability can be performed. As the $SiO_2$ film 41 remaining between the Si substrate 1b and the pattern of the PZT layer 6c after patterning the PZT layer, it practically does not affect on function or quality of the microfabrication apparatus since the layer is thin for instance, 15 nm and the manufactured piezoelectric element is driven by applying voltage.

Dissolution or separation of the photoresist pattern 30 can be surely performed with a solvent generally in use, so that the whole process can be further simplified.

[Third Embodiment]

Figure 5A:
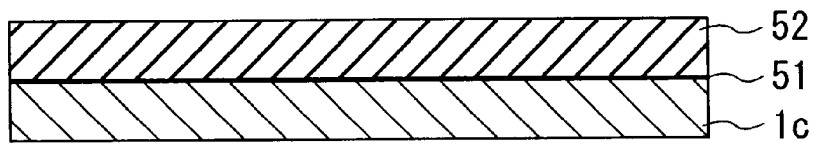
FIGS. 5A to 5E are views specifically showing a step of patterning the PZT layer, which is the functional material layer with a PET film as a pattern in a manufacturing method relative to a third embodiment of the present invention.

FIGS. 5A to 5E are views showing a preferable example for processing a pattern much larger than the above. First, as shown in FIG. 5A, a photoresist 51 is applied onto the Si substrate 1c whose outer dimension is 4 inch long and 400 μm thick with an unillustrated spin coater and so on, then, with employing the photoresist film in a pre-dry state as an adhesive material, a PET (polyethylene terephthalate) film 52 of about 300 μm is laminated, baked and fixed in order not to separate during the following processes hereinafter.

Figure 5B:
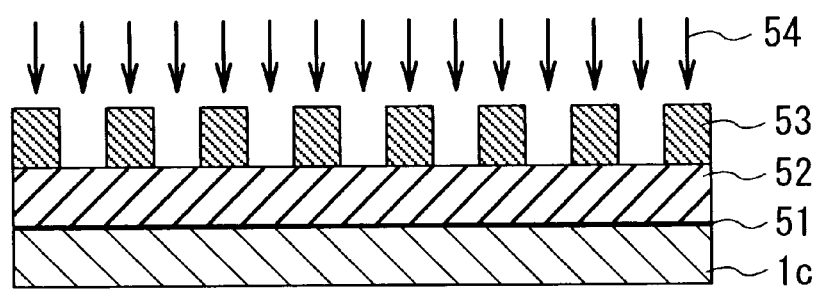
Figure 5C:
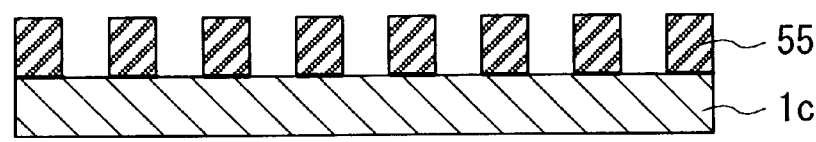

A metal mask 53 excellent in coverage characteristics for a laser as same as SUS (Stainless Steel) materials, is covered thereon as shown in FIG. 5B, and a XeCl (xenon fluoride) excimer laser 54 and so on are irradiated to perform abrasion on the PET film 52 in order to form a pattern 55 whose gap measures by 50 μm wide, 300 μm thick and 200 μm long as shown in FIG. 5C. The pattern 55 of the PET film processed as described above is substantially used as a pattern similar to the mask pattern 4 made of the Si layer 2 in the first embodiment.

Following this, the whole body including the Si substrate is disposed inside the unillustrated vacuum chamber, and subjected to plasma ashing in order to completely remove residues of the abraded PET film or adhesive materials and so on remaining in an open portion of the patterned PET film (the both illustrations are omitted). While the Si substrate is kept inside the vacuum chamber, a PZT particle flow 56 is insufflated on the whole substrate with the gas deposition method so as to deposit PZT layers 6e and 6f of 150 μm, for instance.

Figure 5D:
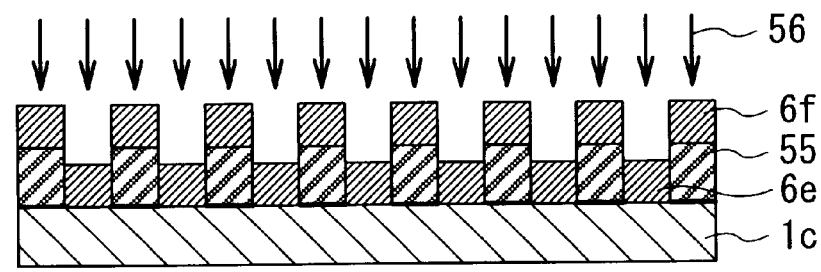
Figure 5E:
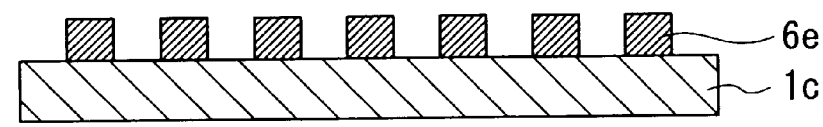

Then, as shown in FIG. 5D, the photoresist 51 used as the adhesive material including the Si substrate is immersed in an organic solvent to fuse, thereby removing or separating the pattern 55 of the PET film from the Si substrate. This also removes the PZT layer 6f formed on the pattern 55, which can obtain the pattern of the PZT layer 6e of 50 μm in width, 150 μm in height, and 200 μm in length, for instance.

As described above, the processes employing the PET film as the mask pattern of the lift-off are preferable for the case where a pattern, which is larger than a pattern using the Si layer or the photoresist as a mask pattern, is obtained. In addition, the pattern having the high aspect ratio can be further ensured to form with excellent repeatability since the PET film is separated in one-sheet state without cutting.

The present invention is not limited to the above embodiments. The size, material, process condition and so on can be modified without departing from the spirit of the invention. For instance, in the first embodiment, the Si portion of the SOI substrate may be employed as a substrate. The etching method of Si is not limited to the Boch process and can employ a dry etching process excellent in direction preference characteristics.

In the second embodiment, Si may be patterned by wet etching with a HF-HNO$_3$ solution instead of XeF$_2$ gas. The SiO$_2$ film employed as the cap film may be formed by, for instance, an evaporation method besides the CVD method.

Although in the second embodiment, patterning was performed after laminating the PET film on the Si substrate, a pre-patterned PET film may be laminated, which results in simplifying the process, thereby reducing the manufacturing cost. Instead of the PET film, for instance, an organic compound film such as a polyimide film can be employed. The PET film may be removed by entirely dissolving with the organic solvent instead of separating in the one-sheet state. As an adhesive material for sealing the PET film on the substrate, for instance, various adhesive materials capable of being completely removed with solvents may be employed in stead of the resist.

Although the functional material layer was formed and employed for the micromirror and the microactuator in the above embodiment, the method for manufacturing the microfabrication apparatus relative to the present invention can be applied to functional material layers using piezoelectric materials employed for MEMS such as a micropump, a small-sized ultrasonic motor, a micro ultra sonic generation source. The method is also applied to a method for fabricating an optical microstructure apparatus such as a rugate filter besides MEMS.

As a functional material layer, instead of PZT, for example, soft magnetic materials such as NiZn ferrite with Spinel structure or various functional ceramics materials such as photocatalysts, e.g., TiO$_2$ having an anatase structure can be employed indisputably.

As described above, according to the method for manufacturing the microfabrication apparatus of the present invention, a thick functional material layer is formed as a dense thin film with high temperature. Then, patterning is performed with the process employing the lift-off method where the semiconductor layer, the photoresist, or the organic compound film are employed as a mask pattern. Therefore, the pattern with the high aspect ratio and the excellent edge repeatability can be obtained, thereby achieving a microstructure apparatus including the structure made of the thick functional material and excellent in performance characteristics and output characteristics.

Obviously many modifications and variations of the present invention are possible in the light of the above teachings. It is therefore to be understood that within the scope of the appended claims the invention may be practiced otherwise than as specifically described.

What is claimed is:

1. A method for manufacturing a microfabrication apparatus comprising steps of:
   forming a mask pattern by providing a trench or a gap deeper than a desired functional material layer within a semiconductor layer;
   depositing the functional material layer in a manner to be thinner than the semiconductor layer; and
   obtaining a pattern of the functional material layer by removing the mask pattern.

2. A method for manufacturing a microfabrication apparatus according to claim 1 comprising a step of:
   bonding the silicon substrate on another substrate with an anodix oxidation method;
   wherein the silicon substrate is employed as the semiconductor layer.

3. A method for manufacturing a microfabrication apparatus according to claim 1, wherein a silicon portion of a SOI substrate is employed as the semiconductor layer.

4. A method for manufacturing a microfabrication apparatus according to claim 1, wherein the functional material layer is deposited with a gas deposition method.

5. A method for manufacturing a microfabrication apparatus according to claim 1, wherein the mask pattern is formed by a dry etching method using SF$_6$ gas and C$_4$F$_8$ gas.

6. A method for manufacturing a microfabrication apparatus according to claim 1, wherein the mask pattern is selectively removed with XeF$_2$ or BrF$_3$.

7. A method for manufacturing a microfabrication apparatus comprising steps of:
   forming a mask pattern by coating a surface of a photoresist layer with a cap film after a trench or a gap deeper than a desired functional material layer is provided within the photoresist layer;
   depositing the functional material layer in a manner to be thinner than the photoresist layer at least in the trench or the gap of the mask pattern; and
   obtaining a pattern made of the functional material layer by removing the mask pattern.

8. A method for manufacturing a microfabrication apparatus according to claim 7, wherein the functional material layer is deposited with a gas deposition method.

9. A method for manufacturing a microfabrication apparatus comprising steps of:
   forming a mask pattern by providing a trench or a gap deeper than a desired functional material layer within an organic compound film;
   depositing the functional material layer in a manner to be thinner than the organic compound film at least in the trench or the gap of the mask pattern; and
   obtaining a pattern of the functional material layer by removing the mask pattern.

10. A method for manufacturing a microfabrication apparatus according to claim 9, wherein the trench or the gap is provided within the organic compound film with a laser abrasion method.

11. A method for manufacturing a microfabrication apparatus according to claim 9 comprises a step of laminating the organic compound film on another substrate.

12. A method for manufacturing a microfabrication apparatus according to claim 11, wherein after the trench or the gap is provided within the organic compound film, the organic compound film is laminated on another substrate.

13. A method for manufacturing a microfabrication apparatus according to claim 9, wherein the functional material layer is deposited with the gas deposition method.

* * * * *